United States Patent
Johnson et al.

(10) Patent No.: US 6,842,075 B2
(45) Date of Patent: Jan. 11, 2005

(54) GAIN BLOCK WITH STABLE INTERNAL BIAS FROM LOW-VOLTAGE POWER SUPPLY

(75) Inventors: Douglas M. Johnson, Doylestown, PA (US); Henry Z. Liwinski, North Wales, PA (US)

(73) Assignee: Anadigics, Inc., Warren, NJ (US)

(*) Notice: Subject to any disclaimer, the term of this patent is extended or adjusted under 35 U.S.C. 154(b) by 51 days.

(21) Appl. No.: 10/319,921

(22) Filed: Dec. 13, 2002

(65) Prior Publication Data

US 2003/0155977 A1 Aug. 21, 2003

Related U.S. Application Data

(63) Continuation-in-part of application No. 09/875,117, filed on Jun. 6, 2001, now Pat. No. 6,515,546.

(51) Int. Cl.[7] .............................. H03F 3/04; H03F 1/38
(52) U.S. Cl. ........................ 330/296; 330/288; 330/291
(58) Field of Search ................................ 330/296, 288, 330/291

(56) References Cited

U.S. PATENT DOCUMENTS

| | | | |
|---|---|---|---|
| 2,663,806 A | 12/1953 | Darlington | 307/88 |
| 3,168,706 A | 2/1965 | Brenig | 330/18 |
| 3,392,342 A | 7/1968 | Ordower | 330/22 |
| 3,491,203 A | 1/1970 | Shabad | 179/1 |
| 3,534,279 A | 10/1970 | Limberg | 330/22 |
| 3,566,289 A | 2/1971 | Cope | 330/19 |
| 3,801,831 A | 4/1974 | Dame | 307/251 |
| 3,855,541 A | 12/1974 | Leidich | 330/22 |
| 3,899,743 A | 8/1975 | Csicsatka | 330/22 |
| RE28,633 E | 11/1975 | Pastoriza | 340/347 |
| 3,936,725 A | 2/1976 | Schneider | 323/1 |
| 3,940,760 A | 2/1976 | Brokaw | 340/347 |
| 3,946,327 A | 3/1976 | Hsu | 330/35 |
| 3,978,473 A | 8/1976 | Pastoriza | 340/347 |
| 3,984,830 A | 10/1976 | Buchanan et al. | 340/347 |
| 4,024,415 A | 5/1977 | Matsuura | 307/362 |
| 4,064,506 A | 12/1977 | Cartwright, Jr. | 340/347 |
| 4,103,246 A | 7/1978 | Limberg | 330/278 |
| 4,117,416 A | 9/1978 | Schade, Jr. | 330/282 |

(List continued on next page.)

FOREIGN PATENT DOCUMENTS

JP    5203457    8/1993    ........... G01C/21/00

OTHER PUBLICATIONS

Yamamoto, et al., "A 3.2–V Operation Single–Chip Dual–Band AlGaAs/GaAs HBT MMIC Power Amplifier with Active Feedback Circuit Technique" in IEEE Journal of Solid–State Circuits, Aug. 2000, pp. 1109–1120.

*Primary Examiner*—Patricia Nguyen
(74) *Attorney, Agent, or Firm*—Morgan, Lewis & Bockius, LLP (57) ABSTRACT

A transistor bias circuit is provided that is capable of operating from a power supply voltage that is slightly higher than twice the base-emitter voltage of the transistor to be biased. The bias circuit includes a transistor connected in a current-mirror configuration with the transistor to be biased. A feedback circuit maintains the mirrored current at a constant level. The gain of the feedback circuit is improved by the addition of a non-inverting amplifier within the feedback circuit. In a preferred embodiment, the biased transistor is concurrently in both a Darlington and the current mirror configuration. Moreover, a feedback transistor in the feedback circuit is also concurrently in the Darlington configuration, thus providing an efficient biasing arrangement for an amplifier block based on the Darlington arrangement.

18 Claims, 4 Drawing Sheets

U.S. PATENT DOCUMENTS

| | | | |
|---|---|---|---|
| 4,117,417 A | 9/1978 | Ahmed | 330/288 |
| 4,119,924 A | 10/1978 | Ahmed | 330/288 |
| RE29,910 E | 2/1979 | Ahmed | 330/51 |
| 4,140,977 A | 2/1979 | Ahmed | 330/288 |
| 4,241,315 A | 12/1980 | Patterson, III et al. | 330/261 |
| 4,329,247 A | 5/1982 | Palmer | 510/244 |
| 4,361,816 A | 11/1982 | Schade, Jr. | 330/288 |
| 4,450,366 A | 5/1984 | Malhi et al. | 327/538 |
| 4,462,005 A | 7/1984 | Kusakabe | 387/750 |
| 4,475,077 A | 10/1984 | Nagano | 323/312 |
| 4,525,682 A | 6/1985 | Lai et al. | 330/288 |
| 4,654,602 A | 3/1987 | Aoki | 330/257 |
| 4,857,864 A | 8/1989 | Tanaka et al. | 330/288 |
| 4,897,614 A | 1/1990 | Nishio | 330/257 |
| 4,990,864 A | 2/1991 | Kwan | 330/288 |
| 5,079,518 A | 1/1992 | Wakayama | 330/288 |
| 5,283,537 A | 2/1994 | Nakamura | 330/288 |
| 5,307,023 A | 4/1994 | Schade, Jr. | 330/257 |
| 5,398,004 A | 3/1995 | Kobayashi | 330/293 |
| 5,404,585 A | 4/1995 | Vimpari et al. | 455/115 |
| 5,412,336 A | 5/1995 | Barrett, Jr. et al. | 327/560 |
| 5,444,361 A | 8/1995 | Ryat | 323/312 |
| 5,451,908 A | 9/1995 | Böhme | 330/300 |
| 5,548,248 A | 8/1996 | Wang | 330/288 |
| 5,619,160 A | 4/1997 | Sirito-Olivier et al. | 327/530 |
| 5,629,648 A | 5/1997 | Pratt | 330/289 |
| 5,675,611 A | 10/1997 | Lehtinen et al. | 375/297 |
| 5,680,112 A | 10/1997 | Xydis | 340/636 |
| 5,724,004 A | 3/1998 | Reif et al. | 330/277 |
| 5,745,016 A | 4/1998 | Salminen | 333/17.1 |
| 5,752,172 A | 5/1998 | Matero | 455/127 |
| 5,805,015 A | 9/1998 | Bruccoleri et al. | 327/538 |
| 5,819,165 A | 10/1998 | Hulkko et al. | 455/126 |
| 5,831,473 A | 11/1998 | Ishii | 327/530 |
| 5,844,443 A | 12/1998 | Wong | 330/275 |
| 5,883,542 A | 3/1999 | Eriksson | 327/483 |
| 5,884,149 A | 3/1999 | Jaakola | 455/103 |
| 5,966,648 A | 10/1999 | Ortberg et al. | 45/347 |
| 5,986,507 A | 11/1999 | Itakura et al. | 330/288 |
| 5,986,509 A | 11/1999 | Lohninger | 330/290 |
| 6,002,922 A | 12/1999 | Schwent | 455/115 |
| 6,011,439 A | 1/2000 | Colarossi et al. | 330/290 |
| 6,018,646 A | 1/2000 | Myllymaki et al. | 455/115 |
| 6,043,714 A | 3/2000 | Yamamoto et al. | 330/296 |
| 6,052,029 A | 4/2000 | Uda et al. | 330/277 |
| 6,052,032 A | 4/2000 | Järvinen | 330/289 |
| 6,118,409 A | 9/2000 | Pietsch et al. | 347/703 |
| 6,122,532 A | 9/2000 | Taylor | 455/547 |
| 6,181,206 B1 | 1/2001 | Palmisano et al. | 330/278 |
| 6,191,656 B1 | 2/2001 | Nadler | 330/288 |
| 6,195,562 B1 | 2/2001 | Pirhonen et al. | 455/553 |
| 6,211,738 B1 | 4/2001 | Hecht | 330/292 |
| 6,218,904 B1 | 4/2001 | Panther | 330/296 |
| 6,218,906 B1 | 4/2001 | Lohninger | 330/311 |
| 6,242,983 B1 | 6/2001 | Shiao | 330/285 |
| 6,289,205 B1 | 9/2001 | Pollanen et al. | 455/126 |
| 6,300,837 B1 | 10/2001 | Sowlati | 330/296 |
| 6,313,705 B1 | 11/2001 | Dening et al. | 330/276 |
| 6,333,677 B1 | 12/2001 | Dening | 330/296 |
| 6,359,516 B1 | 3/2002 | Luo et al. | 330/296 |
| 6,369,656 B2 | 4/2002 | Dening et al. | 330/296 |
| 6,369,657 B2 | 4/2002 | Dening et al. | 330/296 |
| 6,370,358 B2 | 4/2002 | Liimatainen | 455/67.1 |
| 6,515,546 B2 * | 2/2003 | Liwinski | 330/296 |

* cited by examiner

GAIN BLOCK WITH STABLE INTERNAL BIAS FROM LOW-VOLTAGE POWER SUPPLY

RELATED APPLICATIONS

This application is a continuation-in-part of U.S. patent application Ser. No. 09/875,117 filed Jun. 6, 2001, now U.S. Pat. No. 6,515,546 by Henry Z. Liwinski entitled "Bias Circuit For Use With Low-Voltage Power Supply," which is incorporated by reference herein in its entirety, and claims the benefit thereof under 35 U.S.C. §120.

FIELD OF THE INVENTION

The present invention relates generally to a circuit for biasing a gain block using a large unregulated power supply with the aid of a low-power stable power supply for increased efficiency in the operation of the gain block.

BACKGROUND OF THE INVENTION

Modern wireless communications devices, such as cellular telephones, are held to ever-higher performance standards. Transmissions must be clear and undistorted, and the battery in the devices must be small and have a long life. In order to meet these consumer requirements, wireless telephone designers have moved away from using traditional silicon-based bipolar transistors as power amplifiers and toward using more exotic transistors, such as heterojunction bipolar transistors ("HBTs") made of aluminum-gallium-arsenide/gallium-arsenide ("AlGaAs/GaAs"), indium-gallium-phosphide/gallium-arsenide ("InGaP/GaAs"), InGaP/GaAsN, and double heterojunction bipolar transistor (DHBT) in an non-exhaustive listing. Such HBTs provide improved power efficiency and linearity, thus enabling cellular phones to achieve longer battery life and better signal characteristics for voice and data.

Of course, an HBT, like a bipolar junction transistor ("BJT"), requires a direct-current ("DC") bias signal (comprising both a voltage and a current) to be applied to the input terminal to establish its operating point. (The operating point of a transistor may be defined as the point on the transistor's characteristic curves at which the transistor will operate in the absence of an input signal. See, e.g., John Markus, Electronics Dictionary 445 (4th ed. 1979).) Because changes in the DC bias signal affect the operating point of the HBT (and thus adversely affect the linearity of the amplifier), the DC bias signal must be stable and unaffected by variations in temperature or in the power supply voltage. Typically a "bias circuit" generates such a DC bias signal.

In addition, it is desirable to use amplifying circuits based on the HBT, like the BJT, as off-the-shelf gain blocks for implementing particular device designs. An early and still popular design for such gain blocks is based on the Darlington transistor, which is also known as the Darlington pair. The Darlington arrangement is named after Sydney Darlington of Bell Labs who first proposed the arrangement and received the U.S. Pat. No. 2,663,806 describing it on Dec. 22, 1953. The Darlington arrangement provides high current gain by connecting two (or more) transistors in a cascade configuration with the collectors of the transistors connected together and the emitter of one transistor connected to the base of the other transistor. Resistors connected across the base-emitter of each transistor allow independent design of bias current and reduce the time to turn OFF the conducting pair. In principle more than two transistors may be employed in a Darlington arrangement although typically two transistors are used.

An example of a Darlington pair based gain block is the HBT technology based MINI-CIRCUITS® ERA series of amplifiers for wide-band microwave (from about 50 to 8000 MHz) amplification. These amplifiers are four terminal devices with two of the terminals (pins 2 and 4) connected to ground. Biasing is through the output terminal, which is connected to the supply voltage through a biasing resistor and a recommended RF wide-band choke. This arrangement reflects the current biased nature of the device making it more sensitive to current than voltage fluctuations. Hence a voltage source is approximated as a current source with the use of the biasing resistor for adequate biasing. In addition, the supply is isolated from stray signals by a suitable bypass capacitor. The input (at terminal labeled as pin 1) and output (at terminal labeled as pin 3) signals are provided via respective DC blocking capacitors.

Proper biasing of the aforementioned ERA and similar devices requires an adequately regulated supply voltage. In order to maintain constant operating conditions the recommended supply voltage for such devices is, typically, significantly greater than the device voltage. The device voltage, i.e., the voltage across the device, is modeled to be dependent on both the bias current and the temperature such that it increases with increase in bias current and decreases with increase in device temperature. The use of a large biasing resistor proportionally reduces the variation in the bias current due to temperature or voltage changes since most of the change is in the voltage across the biasing resistor. Alternative temperature compensated biasing of ERA like devices includes a combination of a linear positive-temperature-coefficient thermistor in parallel with a regular resistor such that the decrease in device voltage with temperature is offset by an increase in the resistance of this combination, which is placed in series with the biasing resistor.

The approximate current source configurations described above necessarily result in significant resistive losses resulting in low efficiency. For instance, in the described resistive biasing scheme increasing the supply voltage relative to the specified device voltage improves stability by reducing voltage fluctuations at the device due to fluctuations in the supply voltage. However, this increase in stability is coupled with a reduction in the overall efficiency due to increased resistive losses. This tradeoff results in a preferred value for the supply voltage at about twice the device voltage value. In the case of typical Darlington amplifiers, the expected efficiency is about 15% to 25%.

SUMMARY OF THE INVENTION

The invention encompasses bias circuit designs that improve performance and efficiency resulting in longer battery life in portable devices due to reduced power requirement and the ability to use power supplies with lower voltages. In particular, the invention encompasses bias circuits implemented with InGaP/GaAs or AlGaAs/GaAs HBTs that are capable of operating from a regulated supply voltage that is as low as about 2.7 V, which is about twice the junction voltage, for instance the base-emitter junction voltage. Preferably, these circuits may be manufactured on a single integrated circuit. The disclosed circuits employ a current mirror configuration to bias gain blocks. Optionally, the gain blocks include transistors arranged in a cascade, such as a Darlington configuration, for high amplification.

The invention also encompasses transistors of various other types that may be employed to realize cascaded transistors in gain blocks.

The use of the current mirror configuration enables the use of a low voltage regulated supply or a preferred regulated supply to provide a reference current to a master transistor in the current mirror configuration. The mirrored current, being stabilized by its being proportional to the reference current, then is used to bias one or more transistors powered by a relatively unregulated power supply. Thus, the familiar constraint requiring the power supply voltage to be significantly greater than device voltage in order to provide stable biasing is relaxed resulting in lower resistive losses and improved efficiency.

In another aspect, the invention encompasses providing stability with respect to temperature and process variations by way of feedback provided in current mirror configurations disclosed herein. The invention also encompasses configurations wherein one or more transistors in a cascade configuration are also a part of the current mirror configuration or a feedback loop therein.

In a preferred embodiment, the bias circuit includes a first transistor connected in a current-mirror configuration with the transistor to be biased ("the biased transistor") and a feedback circuit. The voltage at the collector of the first transistor is fed back via the feedback circuit to control the voltage at the bases of the first transistor and the biased transistor, which are connected in the current mirror configuration.

The feedback circuit comprises, in a preferred embodiment, a non-inverting amplifier, containing one or more transistors, such that the input of the non-inverting amplifier is connected to the collector of the first transistor and at its output is connected to a second transistor in an emitter-follower configuration. Preferably, the non-inverting amplifier comprises two or more transistors in a cascade connected to the second transistor. The second transistor is connected at its collector to the power supply and at its emitter to the node formed by the bases of the first transistor and the biased transistor. It thus establishes base currents entering the first transistor and the biased transistor. The collector-emitter current passing through the first transistor (which is mirrored in the biased transistor by a proportional current) is thereby maintained substantially constant via negative feedback. The bias circuit additionally comprises several current-limiting resistive elements and one or more inductors that serve as RF chokes.

Also described herein is a method of biasing a first transistor having a base, emitter, and collector via a circuit that includes a second transistor, which, in turn, is connected in a current-mirror configuration with the first transistor. The method includes the steps of monitoring an electrical characteristic (for example, a current or a voltage) at the collector of the second transistor, amplifying the monitored characteristic, and feeding back the amplified characteristic to control the second transistor. The step of amplifying may further include the steps of inverting the monitored characteristic and, optionally, re-inverting the characteristic. In addition, the method optionally comprises level-shifting the monitored characteristic.

In an aspect of the invention, the feedback circuit preferably provides a positive gain at low frequencies, including DC, to bias one or more transistors, and a lower gain and optional phase adjustment at higher frequencies, such as the RF frequencies amplified by the gain block, to provide stable performance. The adjustment of the gain at high frequencies may be provided by a suitable reactance in the feed back circuit, for instance a capacitor to shunt the high frequencies, and the like.

DETAILED DESCRIPTION OF THE INVENTION

In general, the illustrative circuits described in FIGS. 1–4 may be used to bias a one or more transistor. A regulated low voltage supply terminal provides a reference current to a master transistor in a current mirror configuration. The mirrored current to a second transistor in the current mirror configuration serves as a suitable biasing current. The second transistor, biased by the current mirror arrangement, may concurrently be in a cascade arrangement of transistors. A power supply, including unregulated power supplies, may be connected to an output terminal with suitable isolation from the output signal, to provide the biasing current in accordance with a mirror current to the second transistor in the current mirror configuration. The cascade arrangement of transistors, when present, may be used to provide high gain to an input signal. The described arrangement is preferably further stabilized by a feedback circuit comprising an amplifier to counteract variations at a current-sink terminal of the master transistor by adjusting the voltage at the control terminals of transistors in the current mirror.

Although, various embodiments of the invention are described as a bias circuit composed of HBTs, the invention is not limited to such transistors. An alternative embodiment of the invention may be readily constructed with, e.g., npn-type or pnp-type BJTs, other varieties of HBTs, or field-effect transistors ("FETs"). The invention is particularly suited for use whenever the supply voltage is only slightly higher than twice the base-emitter voltage (for bipolar transistors) or the gate-source voltage (for FETs) of the transistors used in the bias circuit.

In the illustrative current mirror biasing arrangements described herein, a negative feedback loop provides a stable voltage at the base of the transistors in the current mirror configuration. The effectiveness of this feedback is directly sensitive to the gain in the loop, which is close to the gain of feedback amplifier times the gain of the reference transistor (also known as the master transistor). The gain is for providing biasing rather than amplifying high frequency signals, which may result in unstable operation. Therefore, the gain and phase relationships are tailored to ensure gain at low frequencies, preferably DC, while having a reduced or even absence of a gain at high frequencies that are to be amplified by the one or more transistors in the current mirror configuration. Such adjustments to the loop gain may be made by the introduction of suitable reactances such as capacitors, inductors and the like.

Figure 1:
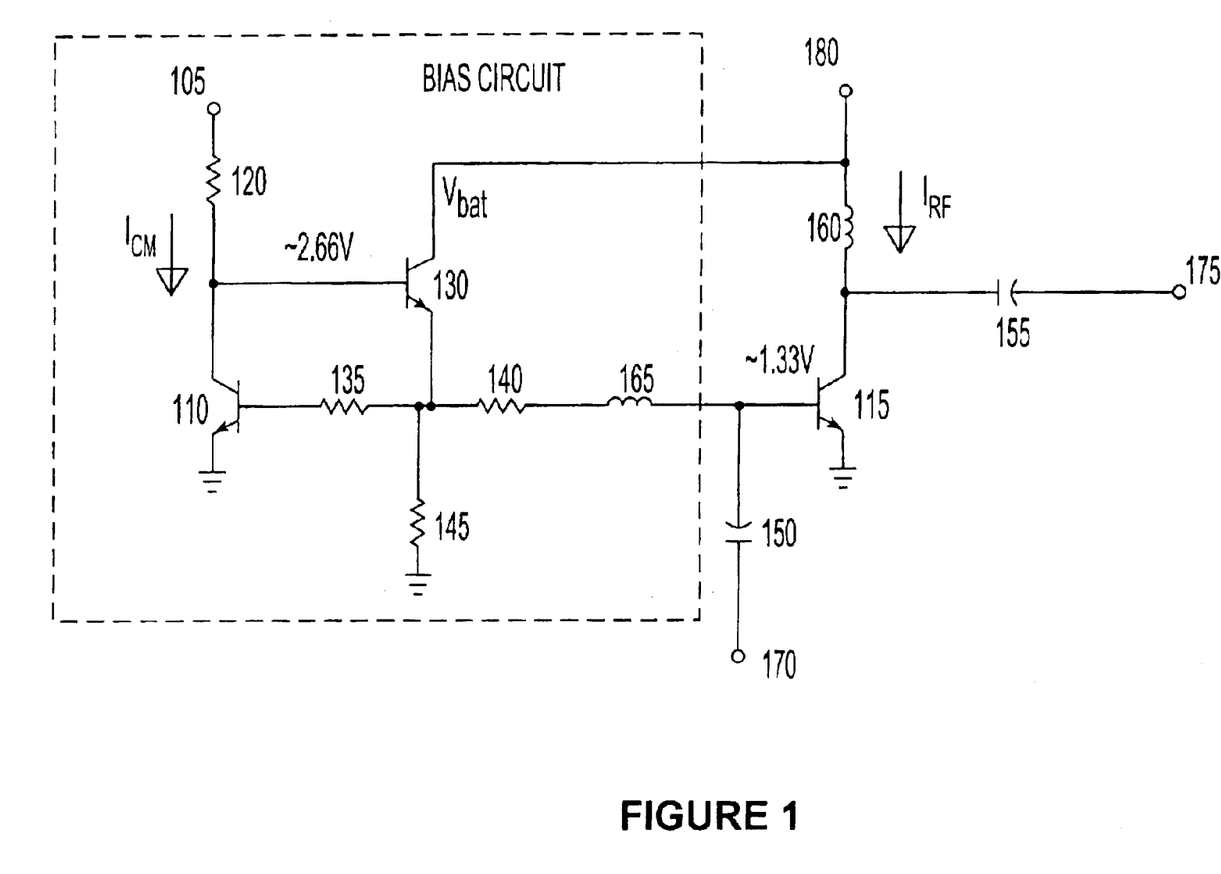
FIG. 1 shows a schematic circuit diagram illustrating a bias circuit using a current mirror configuration.

An example circuit of a current mirror arrangement is presented in FIG. 1. The input RF signal is received at input terminal 170 while the output is provided via capacitor 155 at output terminal 175. Reference resistor 120 in series with a voltage supply connected to terminal 105 provides a reference current $I_{CM}$. Reference resistor 120 cannot be so large as to result in the voltage at the collector of transistor 110 falling below 2.66V because transistors 130 and 115 require a voltage drop of at least twice the base-emitter voltage for being turned ON. Because transistors 130 and 115 are "stacked", the circuit operates well only from a, power supply voltage that is substantially higher than twice the base-emitter voltage of the stacked transistors. Therefore for the illustrated circuit of FIG. 1, with InGaP/GaAs or AlGaAs/GaAs HBTs (requiring a base-emitter voltage (VBE) of about 1.33 V in order to operate) a voltage of 2.66 V is required as is indicated in FIG. 1. Also shown in FIG. 1 are the optional resistors 135, 140, and 145. In addition, preferably capacitors 150 and 155 block DC from the RF signal along with inductor 160, which is optional and may be replaced, for instance by a resistor, while optional inductor 165 provides RF isolation to RF amplifying transistor 115 from the master transistor 110.

Figure 2:
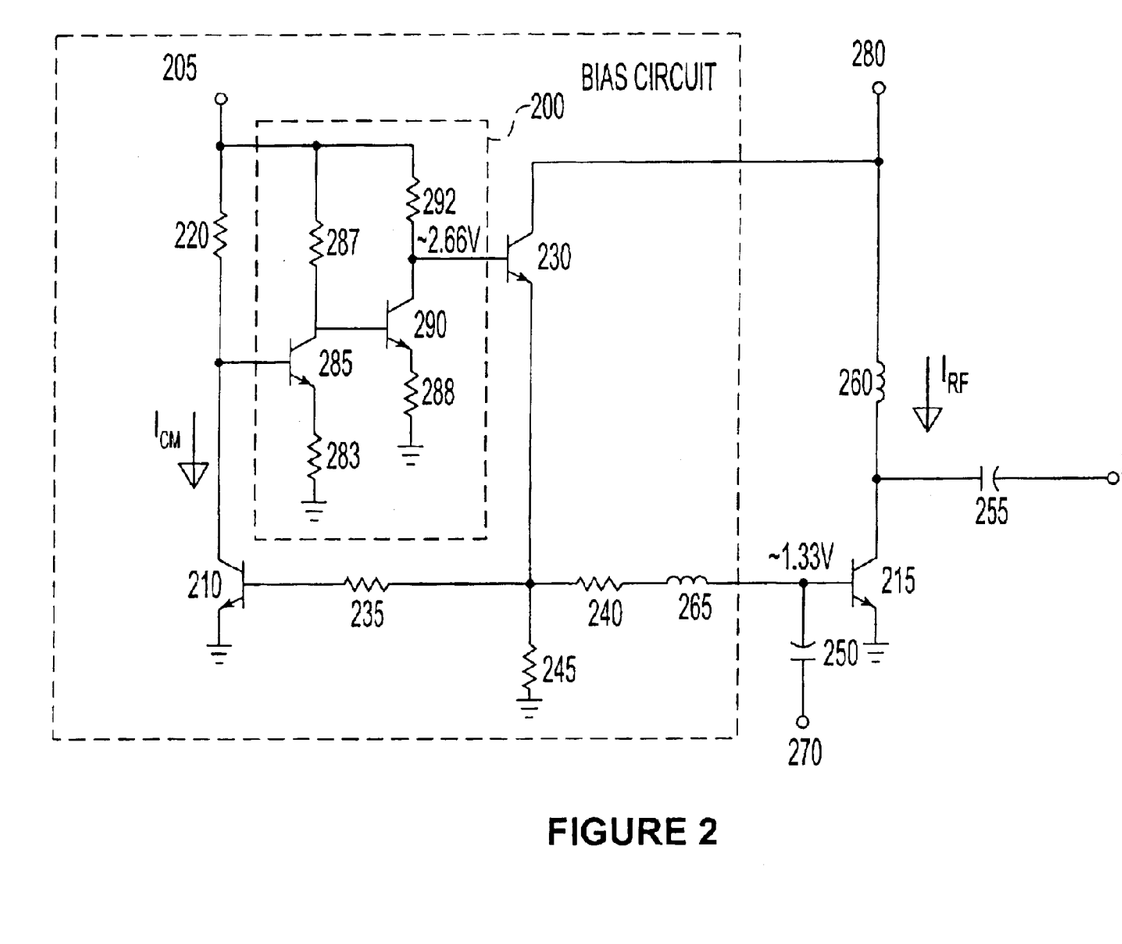
FIG. 2 shows another schematic circuit diagram illustrating a bias circuit using a current mirror configuration with feedback.

Another example bias circuit that can operate from lower supply voltages is illustrated in FIG. 2 with non-inverting amplifier 200 comprising additional transistors 285 and 290 and optional resistors 283, 287, 288, and 292. Non-inverting amplifier 200 serves, inter alia, two functions: (1) level-shifting the voltage at the collector of transistor 210 (and the base of transistor 285) to the required operating voltage of transistor 230; and (2) amplifying fluctuations in the voltage at the collector of transistor 210. In the circuit of FIG. 1 (shown without a non-inverting amplifier), the voltage at the collector of transistor 110 is about 2.66 V or more in order for transistors 115 and 130 to operate. In contrast, in the circuit of FIG. 2 the comparable voltage at the collector of transistor 210 may be as low as about 1.5 V.

As in the circuit of FIG. 1, in FIG. 2 preferably inductors 260 and 265 serve as RF chokes. Inductors 260 and 265 are optional and inductor 260 may be replaced by a resistor in some embodiments. When present, inductor 265 isolates the bias circuit. A power supply voltage is applied through inductor 260 to transistor 215. Preferably capacitors 250 and 255 are de-coupling capacitors to isolate DC voltages from the input and output RF signals. Transistors in FIG. 1 or 2 may additionally include, although not shown, resistors between their respective emitters and the ground or other voltage reference. Moreover, one or more of the transistors may be implemented as composite transistors.

The operation of the circuit in FIG. 2 is, believed to be, without being bound by theory, as follows. Resistor 220 establishes a reference current $I_{CM}$ passing through transistor 210 and also a current $I_B$ into the base of transistor 285. If reference voltage $V_{REG}$ increases, both the voltage at the base of transistor 285 and the current $I_B$ correspondingly increase. Thus, the collector-emitter current through transistor 285 increases, and the collector-emitter voltage of transistor 285 decreases, pulling down the voltage at the base of transistor 290 and amplifying the fluctuation in voltage at the base of transistor 285. The decreased voltage at the base of transistor 290 causes the collector-emitter voltage of transistor 290 to increase, thus, pulling up the voltage at the base of transistor 230. The collector-emitter voltage of transistor 230 correspondingly decreases, thus pulling up the voltage at the emitter of transistor 230. The current into the base of transistor 210 in turn increases, causing the collector-emitter voltage of transistor 210 to decrease and thereby pulling down the voltage at its collector back to the desired quiescent value.

Preferably, the non-inverting amplifier 200 provides sufficient gain in the feedback loop to compensate for variations in the supply voltage $V_{REG}$. Thus, power supply voltages as low as 2.65 V may be used with, for instance GaAs HBT. For different transistors this value may be lower or higher depending on the junction voltage, since it should preferably be slightly higher than twice the base-emitter voltage of the transistors in the circuit. For instance, it may be 2.25 for a junction voltage of about 1.1 V.

As discussed previously, the gain in the feedback loop is reduced at higher frequencies, which advantageously include the frequency ranges of interest for amplification of RF signals, to provide stable biasing without compromising stability. To this end, although not shown in FIG. 2, reactance due to one or more capacitors connected between the base of transistor 230 and ground, the base of transistor 285 and the emitter of transistor 290, the collector of transistor 290 and emitter of transistor 285, parasitic capacitance, and the like adjusts the loop gain at high frequencies. In an example circuit, a capacitance of about 1000 pF between the base of transistor 230 and the ground (or reference) may be employed.

The disclosed invention further encompasses the current mirror based biasing scheme applied to biasing gain blocks, and in particular to gain blocks using Darlington configurations. It is believed, without intending to be bound by any theory, that in a current-mirror configuration based bias circuit, a reference resistor may establish a reference current. If the temperature characteristics of the two transistors connected in the current mirror configuration are substantially the same, then the circuit is relatively insensitive to fluctuations in temperature.

Figure 3:
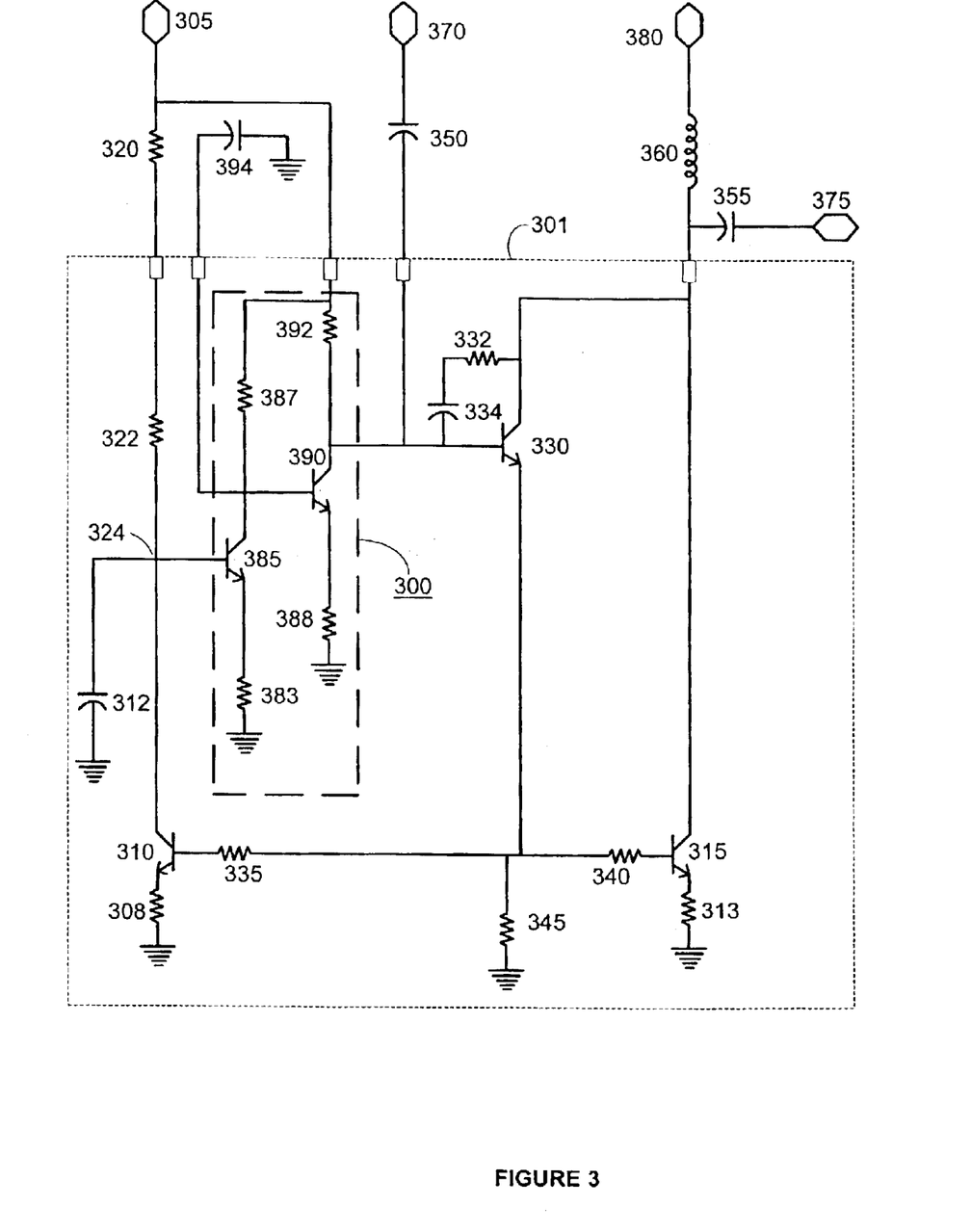
FIG. 3 shows a schematic circuit diagram of a bias circuit using a current mirror configuration with an amplifier circuit to provide stability against fluctuations, for instance due to temperature and/or supply voltage, and using a reference voltage supply and another voltage supply.

FIG. 3 illustrates an embodiment of the invention for biasing a transistor in a Darlington configuration. In this circuit regulated low voltage supply terminal 305 provides a reference current, via resistances 320 and 322, wherein optional resistance 320 is external to integrated circuit 301. The reference current flows to first transistor 310, which is in a current mirror configuration, via resistors 335 and 340 with second transistor 315. Resistor 345 is an optional component that is useful in sinking excess current through transistor 330. Along with resistors 335 and 340, resistor 345 may be used as a design parameter for the current mirror configuration. In addition, amplifier 300 provides feedback responsive to variations at current-sink terminal 324 of first transistor 310. It should be noted that second transistor 315 in the current mirror configuration is also in a Darlington arrangement, illustrated for instance, by its combination with transistor 330.

Radio frequency (RF) signals are received at input 370 coupled to transistor 330 via blocking capacitor 350. The output signal is provided at output terminal 375 via DC blocking capacitor 355. Output terminal 375 is also connected to power supply terminal 380 that provides a biasing current to the Darlington arrangement in accordance with the current mirror configuration. Capacitor 355 and RF choke 360 allow substantial isolation of the output RF signal from the DC power supply connected to terminal 380. Similarly capacitor 350 blocks the DC current from the input RF signal at terminal 370. An optional RF choke (not shown) between the emitter terminal of transistor 330 and the control terminal of transistor 310 provides further isolation of the RF amplifying transistors 330 and 315 from the transistor 310.

One or more of optional resistors 335, 340, 345, 308, 313, 387, 383, 392, and 388 may be left out in alternative embodiments of the invention. Typically resistors 308 and 313 are matched along with transistors 310 and 315 in the current mirror configuration. Optional resistor 345 provides a current sink to limit the current into the control terminals of the transistors in the current mirror configuration. Capacitors 394 and 312 function, in one aspect, to stabilize the feed back loop by reducing the loop gain at high frequencies. Capacitor 394 is connected between the control terminal of transistor 390 and the reference ground, while capacitor 312 is connected between the control terminal of transistor 310 and the reference ground. Similarly, capacitor 334 preferably provides a DC block, and with resistor 332 helps shape the loop gain to enhance stability of the bias circuit.

Without intending to be bound by any theory, the circuit depicted in FIG. 3 is believed to enable drawing of a stable biasing current from power supply terminal 380. This biasing current, unlike the typical gain block biasing circuits, does not require a large resistance in series with a large voltage source to approximate a stable current source. This is believed to be due to the current mirror relationship between the biasing current and the reference current passing through transistor 310. Moreover, the current mirror configuration is stabilized to compensate for temperature and regulated supply variations by the feedback provided by amplifier 300. Amplifier 300 comprises, inter alia, transistors 385 and 390 for amplifying the variations, typically due to temperature and supply voltage changes, at current-sink terminal 324 of first transistor 310 to provide feedback to counter such changes. This feedback adjusts the biasing current into the control terminals of transistors 310 and 315 via transistor 330 as shown in FIGS. 3 and 4 in a manner similar to the operation of the circuit of FIG. 2.

FIG. 3 illustrates transistor 330 in both the Darlington configuration and the feedback loop via a connection to amplifier 300. The Darlington configuration, of course, may include more than two transistors to regulate the biasing currents in alternative embodiments. Transistor 330 is always ON with amplifier 300 output providing its control voltage for biasing it. Variations in voltage due to the input RF signal are typically too small to influence the biasing of transistor 330. Resistor 332 and capacitor 334 across the collector and base of transistor 330 provide optional current shaping and/or stability. In addition, transistor 315 is both in the current mirror configuration and the Darlington configuration. The current mirror configuration provides stable biasing, in effect DC or relatively slowly varying voltage or currents, while the Darlington configuration provides a high gain to relatively high frequency signals.

Figure 4:
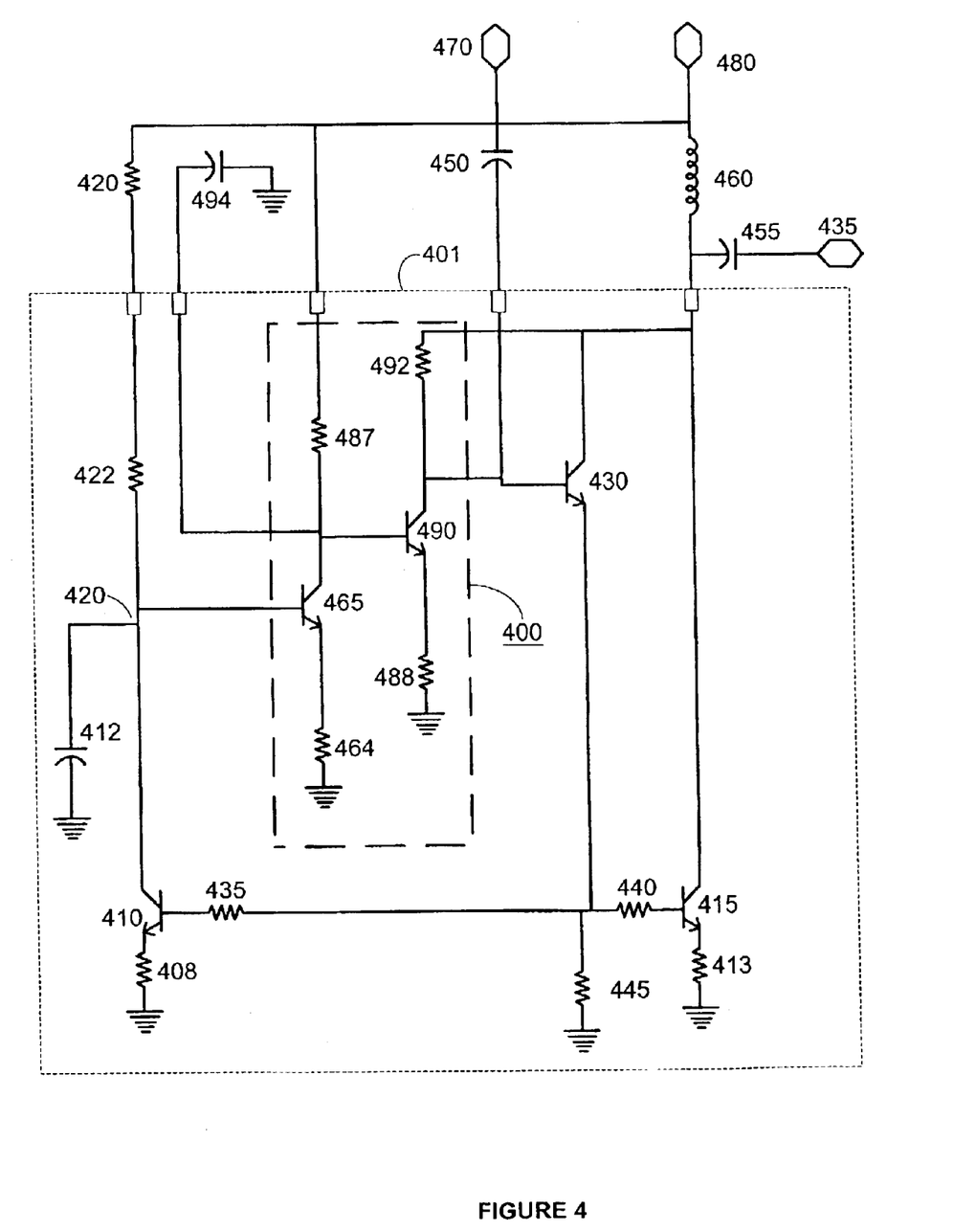
FIG. 4 shows a schematic circuit diagram of a bias circuit using a current mirror configuration with an amplifier circuit to provide stability against fluctuations, for instance due to temperature and/or supply voltage, with a single supply.

FIG. 4 illustrates another embodiment with like elements being numbered with similar numerals as in FIGS. 1–3 to indicate similar components. In one respect, the embodiment shown in FIG. 4 differs from that in FIG. 3 in that it requires only one power supply for its gain block implemented in integrated circuit 3. This embodiment also provides protection against supply voltage and temperature variations by the feedback mechanism previously described in the context of FIG. 3.

As in FIG. 3, one or more of optional resistors 435, 440, 445, 408, 413, 487, 483, 492, and 488 may be left out in alternative embodiments of the invention. Typically resistors 408 and 413 are matched along with transistors 410 and 415 in the current mirror configuration. Optional resistor 445 provides a current sink to limit the current into the control terminals of the transistors in the current mirror configuration. Capacitors 494 and 412 function, in one aspect, to stabilize the feed back loop by reducing the loop gain at high frequencies. Capacitor 494 is connected between the control terminal of transistor 490 and the reference ground, while capacitor 412 is connected between the control terminal of transistor 410 and the reference ground.

It is believed that the lower losses and improved efficiency result from the circuits shown in FIGS. 3 and 4 because a large power supply voltage compared to the device voltage is not required for implementing a stable current source to bias the Darlington configuration. For instance, providing a reference current to a master transistor from a regulated low voltage supply requires a smaller resistive loss than employing a high voltage supply. A mirror current related to the reference current may be drawn from another supply, not necessarily as well regulated as the supply connected to terminal 305 or 405, to provide a biasing current that is almost as well regulated as the reference current. This mirror current is suitable as a biasing current for a Darlington arrangement with lower resistive losses compared to the typical gain block biasing schemes.

It should be noted that the Darlington arrangement illustrated in FIG. 3 or 4 is not intended to be limit the scope of the invention, and instead is illustrative. Thus, additional Darlington arrangements may be connected. For instance, there may be another transistor similar to transistor 315 (or transistor 415) that may be concurrently in a current mirror and a Darlington configuration.

In designing a circuit for biasing a Darlington arrangement, multiple paths are provided for the reference current through a master transistor and a mirror current related to the reference current. The mirror current is suitable for biasing transistors coupled in a Darlington arrangement such that one of the transistors is also a slave transistor in the current mirror arrangement. The mirror current is related to the reference current by the relative transconductances of the master and slave transistors. The relative transconductances, a scaling factor, are determined by the choice of resistors and the matching of the master and slave transistors in the current mirror configuration.

In summary, methods and systems have been disclosed for providing a bias circuit capable of operating from a power supply that produces a voltage that is only slightly higher that twice the base-emitter voltage of the biased transistor. This bias circuit is suitable for biasing a gain block, for instance a Darlington configuration. Preferably, one of the transistors in the Darlington configuration is a slave transistor in the current mirror configuration, while another transistor in the Darlington configuration is part of a feedback circuit to counter variations due to temperature and supply voltage. The disclosed bias circuit is made relatively insensitive to fluctuations in temperature by matching the master transistor in the current mirror configuration to the slave transistor. This condition may be satisfied, for instance, by manufacturing the master and slave transistors as matched transistors. Since one or more of the various transistors may be of the same transistor type as the transistor biased in the described manner, the bias circuit and the biased transistor may be implemented on the same integrated circuit.

One skilled in the art will recognize that the disclosed system and methods admit of many variations in addition to those noted previously. Alternative, embodiments of the bias circuit of the present invention are possible by, for instance eliminating one or more of inductors, capacitors, or the various optional resistors. Although many of these elements are optional, the stability and operation of the bias circuit is often improved by their presence in different embodiments. In addition, for particular bias circuits and the power amplifiers (for example based on the type of transistor used, the gain in the bias circuit feedback loop, or the parameters of the non-inverting amplifier), the stability of the bias circuit may be increased by one or more phase-compensating R-C networks.

Since the invention can be practiced with various types of transistor like devices. For instance, either bipolar and field-effect transistors, or a combination thereof may be used. One or more of the transistors may be implemented as composite transistors. Since the bipolar and field-effect transistors types of transistors have terminals that are generally known by different names, the following terms will be used herein to describe generically the terminals of the transistors used in the invention: (1) The term "control terminal" includes, for instance, the gate of a FET and the base of a bipolar transistor; (2) the term "current-source terminal" includes, for instance, the drain of a FET and the collector of a bipolar transistor; and (3) the term "current-sink terminal" includes, for instance, the source of a FET and the emitter of a bipolar transistor.

All references cited herein or otherwise relied upon are incorporated herein by reference in their entirety. It is further understood that the embodiments described herein are merely illustrative and are not intended to limit the scope of the invention. One skilled in the art may make various changes, rearrangements and modifications to the illustrative embodiments described above without substantially departing from the principles of the invention, which is limited only in accordance with the claims. Accordingly, all such deviations and departures should be interpreted to be within the spirit and scope of the following claims.

What is claimed is:

1. A circuit for biasing a first transistor having a control terminal, current-sink terminal, and current-source terminal and capable of operating at least from a first regulated power supply and a second power supply, the circuit comprising:
   a. a second transistor having a control terminal, current-sink terminal and current-source terminal, wherein the control terminal of the second transistor is connected to the control terminal of the first transistor in a current-mirror configuration, and wherein the current-source terminal of the second transistor is connected to a first terminal of the first regulated power supply;
   b. at least one resistor connected between the current-sink terminal of the second transistor and a second terminal of the first regulated power supply;
   c. a feedback circuit, including a non-inverting amplifier having a feedback transistor, and input and output ports, wherein the input port of the non-inverting amplifier is connected to the at least one resistor and the current-sink terminal of the second transistor; and wherein furthermore a control terminal of a feedback transistor is connected to the output port of the non-inverting amplifier, and a current-source terminal of the feedback transistor connected to the second transistor and the first transistor, with the current-sink terminal of the feedback transistor connected to the second terminal of the second power supply,
   whereby the non-inverting amplifier increases the gain of the feedback circuit so that the bias circuit is relatively insensitive to fluctuations In supply voltage or temperature.

2. The circuit according to claim 1, wherein one of the second transistor and the feedback transistor is a BJT, an HBT, DHBT, or a FET.

3. The circuit according to claim 1, further comprising a second resistor coupled between the current-source terminal of the feedback transistor and the first terminal of the first regulated power supply.

4. The circuit according to claim 1, further comprising:
   a. a third resistor coupled between the control terminal of the first transistor and the current-source terminal of the feedback transistor; and
   b. a fourth resistor coupled between the control terminal of the second transistor and the current-source terminal of the feedback transistor.

5. The circuit according to claim 1, wherein the non-inverting amplifier comprises two cascaded transistors, each having a control terminal, current-sink terminal, and current-source terminal.

6. A method of biasing a first transistor having a control terminal, a current-sink terminal, and a current-source terminal and capable of operating from a power supply having positive and ground terminals via a bias circuit including a second transistor connected in a current-mirror configuration with the first transistor, the method comprising the steps of:
   a. monitoring an electrical characteristic at the current-sink terminal of the second transistor;
   b. amplifying the monitored characteristic; and
   c. feeding back the amplified characteristic to control the second transistor.

7. The method of claim 6, wherein the electrical characteristic is one of current and voltage.

8. The method of claim 6, wherein the step of amplifying comprises the steps of inverting the characteristic and then re-inverting the characteristic, the that a non-inverted amplified characteristic is produced.

9. The method of claim 6, further comprising the step of level-shifting the monitored characteristic.

10. A circuit for biasing one or more transistors, the circuit comprising:
    a regulated low voltage supply terminal providing a reference current to a first transistor in a current mirror configuration;
    an amplifier providing feedback to counteract variations;
    a Darlington arrangement comprising a second transistor concurrently in the current mirror configuration;
    an input coupled to at least one transistor in the Darlington arrangement;
    an output terminal; and
    a power supply connected to the second transistor and providing a biasing current to the Darlington arrangement in accordance with a mirror current to the second transistor in the current mirror configuration.

11. The circuit of claim 10, wherein the Darlington configuration consists essentially of two transistors.

12. The circuit of claim 10, wherein the Darlington configuration comprises at least three transistors.

13. The circuit of claim 10, wherein at least one transistor in the Darlington configuration is biased by a current mirror configuration comprising the at least one transistor in the Darlington configuration.

14. The circuit of claim 12, wherein all of the transistors in the Darlington configuration are biased by a current mirror configuration comprising at least one transistor in the Darlington configuration.

15. The circuit of claim 13, wherein the amplifier provides a feedback to adjust biasing of the first and second transistor to counteract variations in a voltage at a current sink terminal of the first transistor.

16. The method of claim 15, wherein the feedback includes a reactance to reduce the gain at high frequencies.

17. A circuit for biasing a plurality of transistors, the circuit comprising:

a regulated low voltage supply terminal providing a reference current to a first transistor in a current mirror configuration;

an amplifier providing feedback to counteract variations;

a cascade arrangement of transistors comprising a second transistor concurrently in the current mirror configuration;

an input coupled to at least one transistor in the cascade arrangement of transistors; and an output terminal connected to a power supply providing a biasing current to the cascade arrangement of transistors in accordance with a mirror current to the second transistor in the current mirror configuration.

18. The circuit of claim 17, wherein the cascade arrangement of transistors is a Darlington arrangement.

* * * * *